United States Patent
Rodgers et al.

(10) Patent No.: US 6,909,107 B2
(45) Date of Patent: Jun. 21, 2005

(54) METHOD FOR MANUFACTURING SIDEWALL CONTACTS FOR A CHALCOGENIDE MEMORY DEVICE

(75) Inventors: John C. Rodgers, Fairfax, VA (US); Jon D. Maimon, Manassas, VA (US)

(73) Assignee: BAE Systems, Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 10/831,785

(22) Filed: Apr. 26, 2004

(65) Prior Publication Data

US 2004/0197976 A1 Oct. 7, 2004

Related U.S. Application Data

(62) Division of application No. 10/331,850, filed on Dec. 30, 2002.

(51) Int. Cl.[7] .......................... H01L 47/00; H01L 21/00; H01L 21/06; H01L 21/332
(52) U.S. Cl. .................................. 257/3; 257/4; 438/95; 438/102; 438/133
(58) Field of Search ........................... 257/3, 4; 438/95, 438/102, 133

(56) References Cited

U.S. PATENT DOCUMENTS

| | | | |
|---|---|---|---|
| 4,242,698 A | 12/1980 | Ghate et al. | |
| 5,276,290 A | 1/1994 | Bladon | |
| 5,321,211 A | 6/1994 | Haslam et al. | |
| 5,407,864 A | 4/1995 | Kim | |
| 5,408,130 A | 4/1995 | Woo et al. | |
| 5,528,000 A | 6/1996 | Allardyce et al. | |
| 5,879,955 A | 3/1999 | Gonzalez et al. | |
| 6,002,140 A | 12/1999 | Gonzalez et al. | |
| 6,111,264 A * | 8/2000 | Wolstenholme et al. | 257/3 |
| 6,124,192 A | 9/2000 | Jeng et al. | |
| 6,337,266 B1 | 1/2002 | Zahorik | |
| 6,340,631 B1 | 1/2002 | Chih-Po et al. | |
| 6,492,656 B2 * | 12/2002 | Zahorik et al. | 257/3 |
| 6,545,903 B1 * | 4/2003 | Wu | 365/148 |
| 6,607,974 B2 * | 8/2003 | Harshfield | 438/618 |
| 6,613,604 B2 * | 9/2003 | Maimon et al. | 438/95 |
| 6,635,951 B1 * | 10/2003 | Zahorik | 257/613 |
| 2003/0193053 A1 * | 10/2003 | Gilton | 257/72 |
| 2004/0038480 A1 * | 2/2004 | Moore et al. | 438/257 |

* cited by examiner

*Primary Examiner*—Matthew Smith
*Assistant Examiner*—Chuong Anh Luu
(74) *Attorney, Agent, or Firm*—Daniel J. Long; Antony P. Ng; Dillon & Yudell LLP

(57) ABSTRACT

A method for manufacturing sidewall contacts for a chalcogenide memory device is disclosed. A first conductive layer is initially deposited on top of a first oxide layer. The first conductive layer is then patterned and etched using well-known processes. Next, a second oxide layer is deposited on top of the first conductive layer and the first oxide layer. An opening is then etched into at least the first oxide layer such that a portion of the first conductive layer is exposed within the opening. The exposed portion of the first conductive layer is then removed from the opening such that the first conductive layer is flush with an inner surface or sidewall of the opening. After depositing a chalcogenide layer on top of the second oxide layer, filling the opening with chalcogenide, a second conductive layer is deposited on top of the chalcogenide layer.

8 Claims, 6 Drawing Sheets

METHOD FOR MANUFACTURING SIDEWALL CONTACTS FOR A CHALCOGENIDE MEMORY DEVICE

This is a division of application Ser. No. 10/331,850, filed Dec. 30, 2002.

The present invention was made under U.S. government contract No. DL-H-546317.

BACKGROUND OF THE INVENTION

1. Technical Field

The present invention relates to memory devices in general, and in particular to chalcogenide memory devices. Still more particularly, the present invention relates to a method for manufacturing sidewall contacts for a chalcogenide memory device.

2. Description of the Prior Art

The use of phase change materials that can be electrically switched between a generally amorphous first structural state and a generally crystalline second structural state for electronic memory applications is well-known in the art. Phase change materials may also be electrically switched between different detectable states of local order across the entire spectrum between the completely amorphous and the completely crystalline states.

Some phase change materials exhibit different electrical characteristics according to their state. For example, chalcogenide materials exhibit a lower electrical conductivity in its amorphous state than it does in its crystalline state. The chalcogenide materials for making memory cells are typically compounds containing one or more elements selected from the group of tellurium, selenium, antimony, and germanium. Such chalcogenide materials can be switched between numerous electrically detectable conditions of varying resistivity in nanosecond time periods by using picojoules of energy. The resulting memory cell is truly non-volatile and will maintain the integrity of the stored information without the need for periodic signal refresh.

The operation of chalcogenide memory cells requires that a region of the chalcogenide memory material, called the chalcogenide active region, be subjected to a current pulse with a current density typically between $10^5$ and $10^6$ amperes/cm$^2$. Such current density may be accomplished by making a small pore or opening in a dielectric material that is itself deposited onto a bottom electrode material. The chalcogenide material is then deposited over the dielectric material and into the pore to contact with the bottom electrode material. A top electrode material is then deposited over the chalcogenide material. Carbon is a commonly used electrode material although other materials, such as molybdenum and titanium nitride, have also been used.

The size of the chalcogenide active region is primarily defined by the volume of chalcogenide material that is contained within the pore delineated by the opening in the dielectric material. The upper portion of the chalcogenide material not contained within the pore acts as an electrode that in turn contacts with the top electrode material. The chalcogenide active region makes contact with the bottom electrode at an interface area that is substantially equal to the cross sectional area of the pore. As a result of such configuration, the interface area of the chalcogenide material within the chalcogenide active region is subjected to the high current density required for the operation of the chalcogenide memory cell. This is an undesirable situation because the high current density at the interface area of the chalcogenide active region with the bottom electrode causes mixing of the bottom electrode material with the chalcogenide material of the chalcogenide active region due to heating and electrophoretic effects. More specifically, the mixing of the electrode material with the chalcogenide material in the chalcogenide active region causes instability of the chalcogenide memory cell during operation.

Furthermore, with current semiconductor processing technology, the minimum achievable dimension of a contact for a chalcogenide memory device is limited by lithography tools. The size of a contact, which is determined by the diameter of the pore, varies with the square of photolithography feature size error and also with the square of the variability in etch bias. Thus, step coverage also becomes an issue because aspect ratio in the pore increases as the pore diameter decreases. This leads to reduced yield, reduced reliability and reduced cycling endurance. Consequently, it is desirable to provide an improve method for manufacturing contacts for a chalcogenide memory device.

SUMMARY OF THE INVENTION

In accordance with a preferred embodiment of the present invention, a first conductive layer is initially deposited on top of a first oxide layer. The first conductive layer is then patterned and etched using well-known processes. Next, a second oxide layer is deposited on top of the first conductive layer and the first oxide layer. An opening is then etched into at least the first oxide layer such that a portion of the first conductive layer is exposed within the opening. The exposed portion of the first conductive layer is then removed from the opening such that the first conductive layer is flush with an inner surface or sidewall of the opening. After depositing a chalcogenide layer on top of the second oxide layer, filling the opening with chalcogenide, a second conductive layer is deposited on top of the chalcogenide layer.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
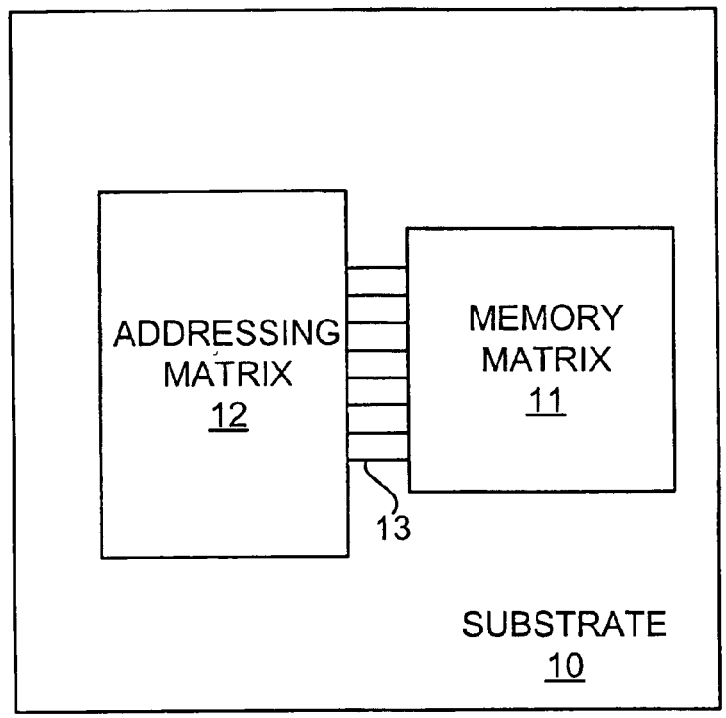
FIG. 1 is a block diagram of a chalcogenide memory device in which a preferred embodiment of the present invention is incorporated.

Referring now to the drawings and in particular to FIG. 1, there is illustrated a block diagram of a chalcogenide memory device in which a preferred embodiment of the present invention is incorporated. As shown, a memory matrix 11 is formed on a substrate 10. Also formed on substrate 10 is an addressing matrix 12 that is suitably connected to memory matrix 11 through connections 13. Addressing matrix 12 preferably includes various signal generating means that control and read pulses applied to memory matrix 11.

Figure 2:
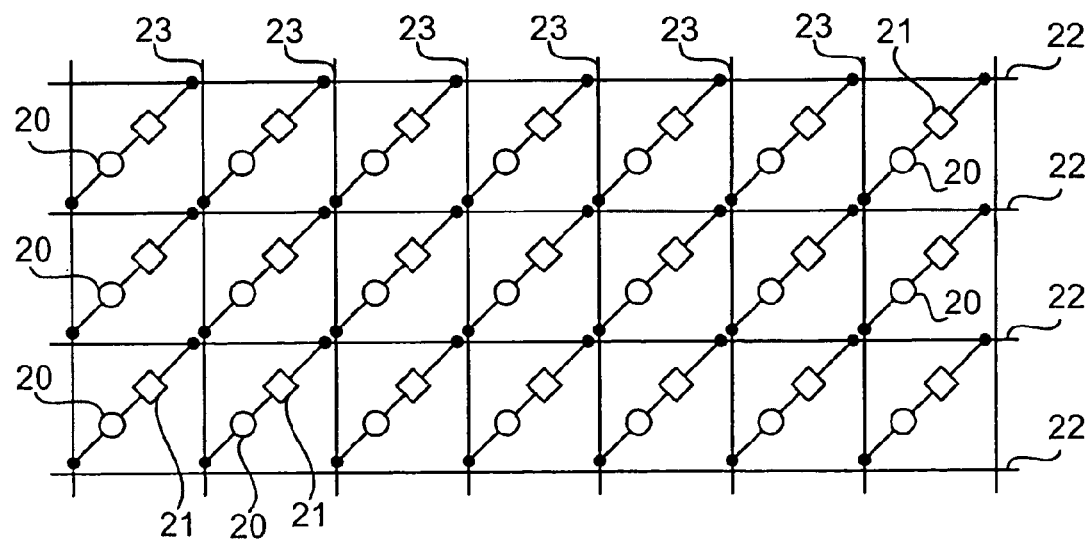
FIG. 2 is a circuit diagram of the memory matrix within the chalcogenide memory device from FIG. 1, in accordance with a preferred embodiment of the present invention.

With reference now to FIG. 2, there is illustrated a circuit diagram of memory matrix 11, in accordance with a preferred embodiment of the present invention. As shown, memory matrix 11 includes an x-y grid with each of memory cells 20 being connected in series with an access device 21 at the cross points of x address lines 22 and y address lines 23. Access device 21 can be a diode or a transistor. Address lines 22 and 23 are separately connected to external addressing circuitry, such as addressing matrix 12 from FIG. 1, in a manner that is well-known in the art.

Figure 3A:
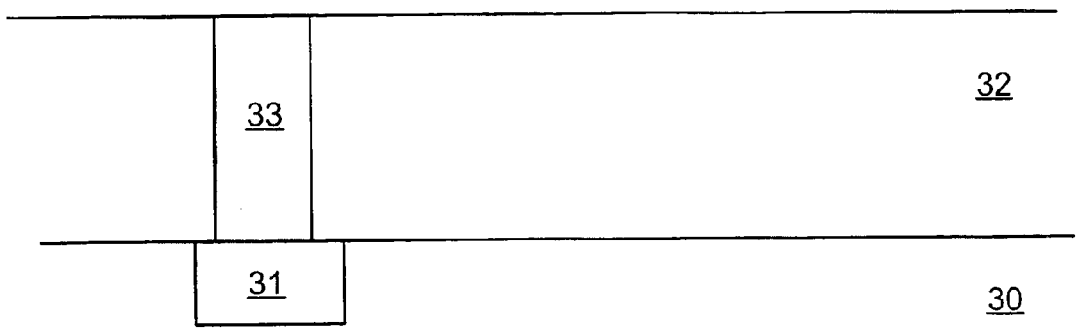
FIGS. 3a–3g are pictorial representations of a process for making a sidewall contact within the chalcogenide memory device from FIG. 1, in accordance with a preferred embodiment of the present invention.

FIGS. 3a–3g are pictorial representations of a process for making a sidewall contact to be used in the chalcogenide memory device from FIG. 1, in accordance with a preferred embodiment of the present invention. In FIG. 3a, a diffusion 31 is first formed within a substrate 30 using well-known masking and doping techniques. Substrate 30 may be silicon, gallium arsenide (GaAs), silicon molybdenum (SiMo) or any wafer material. Next, a dielectric layer 32 is deposited on top of substrate 30. Dielectric layer 32 may be silicon dioxide ($SiO_2$) or silicon nitride ($SiN_2$). A conventional contact (or via) 33 is formed, using well-known masking and etching techniques, within dielectric layer 32. The material sputtered inside contact 33 is preferably tungsten (W). With the current technology, the size of contact 33 is preferably around 0.25 um in diameter.

Figure 3B:
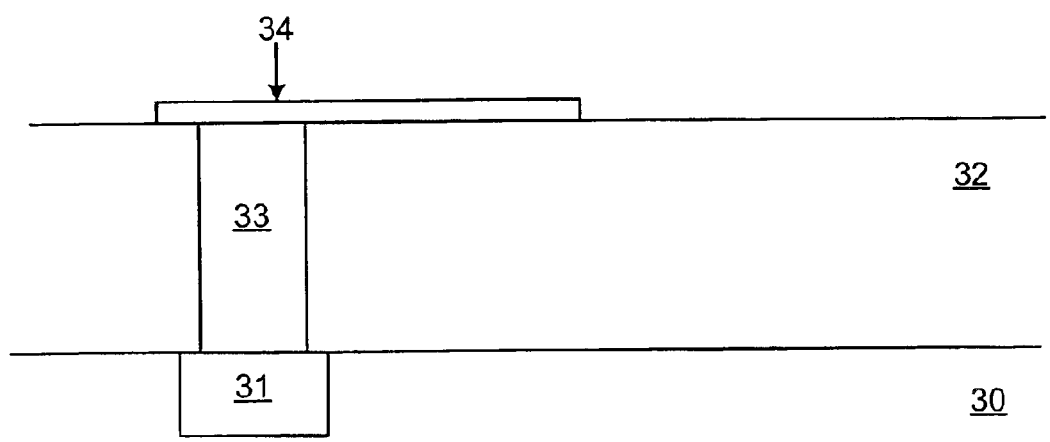

Next, a bottom electrode layer 34 is deposited on top of dielectric layer 32, as shown in FIG. 3b, using well-known masking and depositing techniques. Bottom electrode layer 34 can be a metal layer such as titanium-aluminum nitride (TiAlN) or a polysilicon layer. As shown in FIG. 3b, bottom electrode layer 34 extends from contact 33 to a location at which a sidewall contact will be built. The cross-sectional dimension (i.e., width and thickness) of bottom electrode layer 34 dictates the size of the contact area of the to-be built sidewall contact. Preferably, bottom electrode layer 34 is approximately 300 Å thick.

Figure 3C:
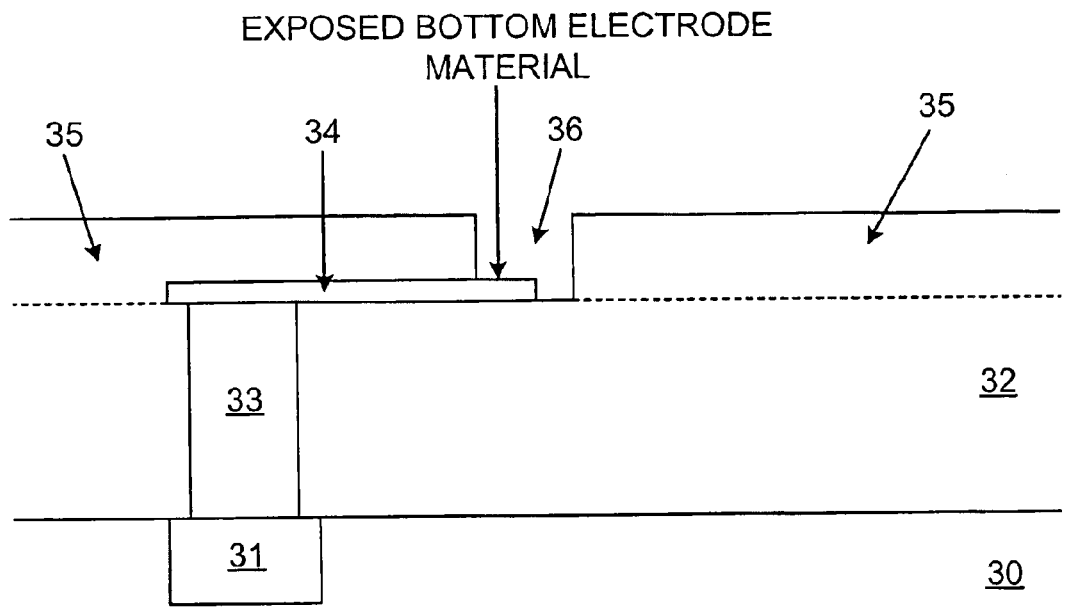

Then, a dielectric layer 35, which may be made of the same material as dielectric layer 32, is deposited on top of bottom electrode layer 34 and dielectric layer 32, as shown in FIG. 3c. Afterwards, a opening 36 is formed near one end of bottom electrode layer 34 within dielectric layer 32, using well-known masking and etching techniques. The diameter of opening 36 may be the same or larger than the diameter of contact 33. With the current technology, the size of opening 36 is preferably around 0.25 um in diameter.

Figure 3D:
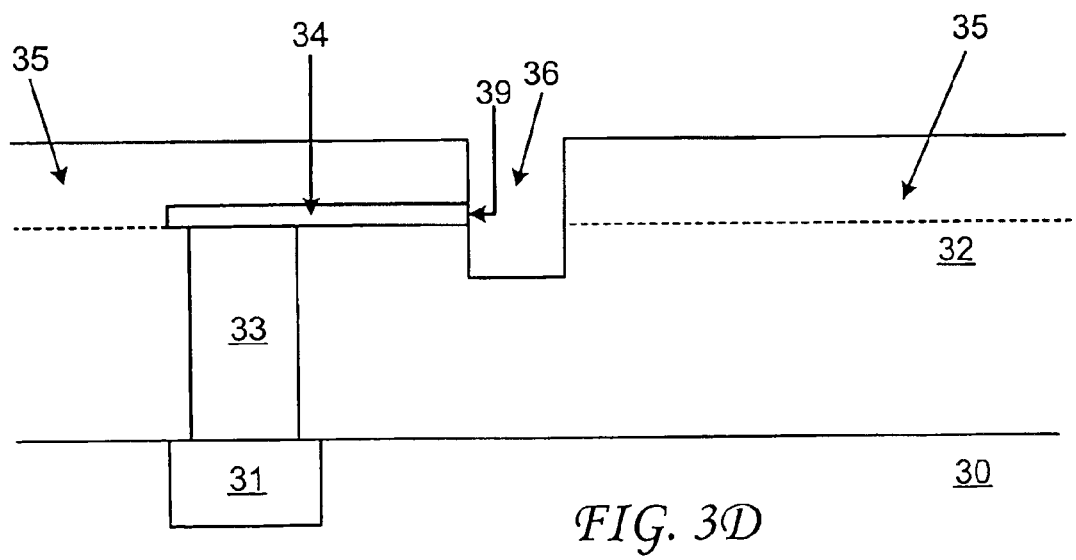

Next, a well-known etching process is use to etch the "exposed" portion of bottom electrode layer 34 within opening 36 to form a sidewall contact 39, as shown in FIG. 3d. A metal etch having high directional etch component is preferably used to reduce undercutting of bottom electrode into the sidewall of opening 36. The size of sidewall contact 39 is the cross-sectional dimension of bottom electrode layer 34. At this point, opening 36 may be optionally etched deeper than dielectric layer 35 (i.e., deeper bottom electrode layer 34), as shown in FIG. 3d.

Figure 3E:
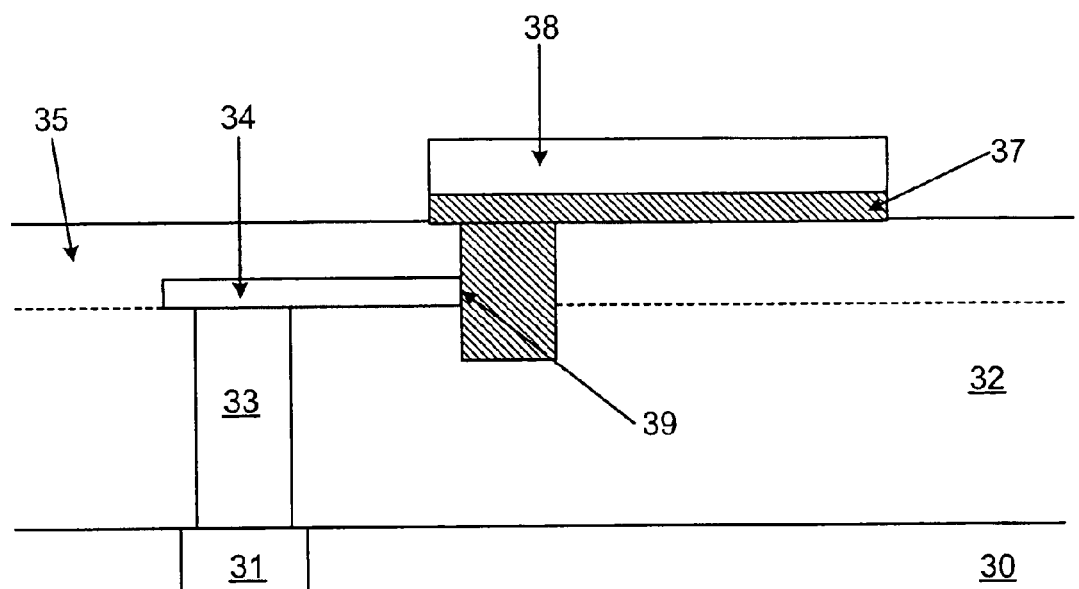

A chalcogenide layer 37 is then deposited on top of bottom dielectric layer 34, as shown in FIG. 3e, using well-known masking and depositing techniques. Preferably, chalcogenide layer 37 is approximately 500 Å thick. As a result of the chalcogenide depositing step, the sidewall of opening 36 is covered with chalcogenide. Hence, sidewall contact 39 is also covered with chalcogenide. Conventional masking and depositing techniques can be used to deposit chalcogenide into opening 36 because the relatively large diameter of opening 36 does not pose any step coverage problem as compared to a relatively small opening. Thus, greater adhesion is made between sidewall contact 39 and chalcogenide layer 37.

Figure 3F:
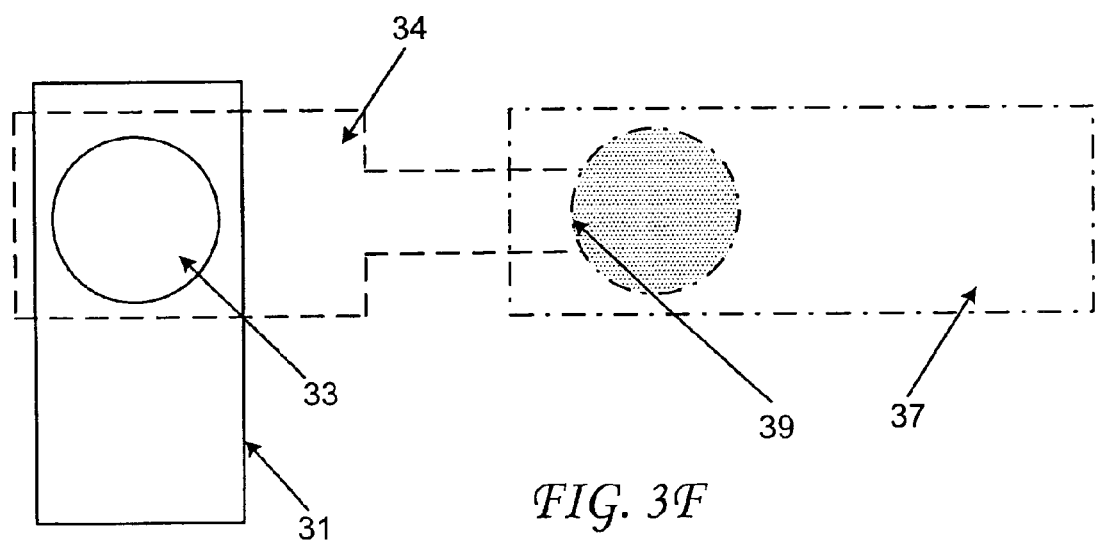

A top view of FIG. 3e is depicted in FIG. 3f. As shown, sidewall contact 39 is in touch with the chalcogenide material within opening 36. Consequently, bottom electrode layer 34 is in electrical connection with chalcogenide layer 37.

Figure 3G:
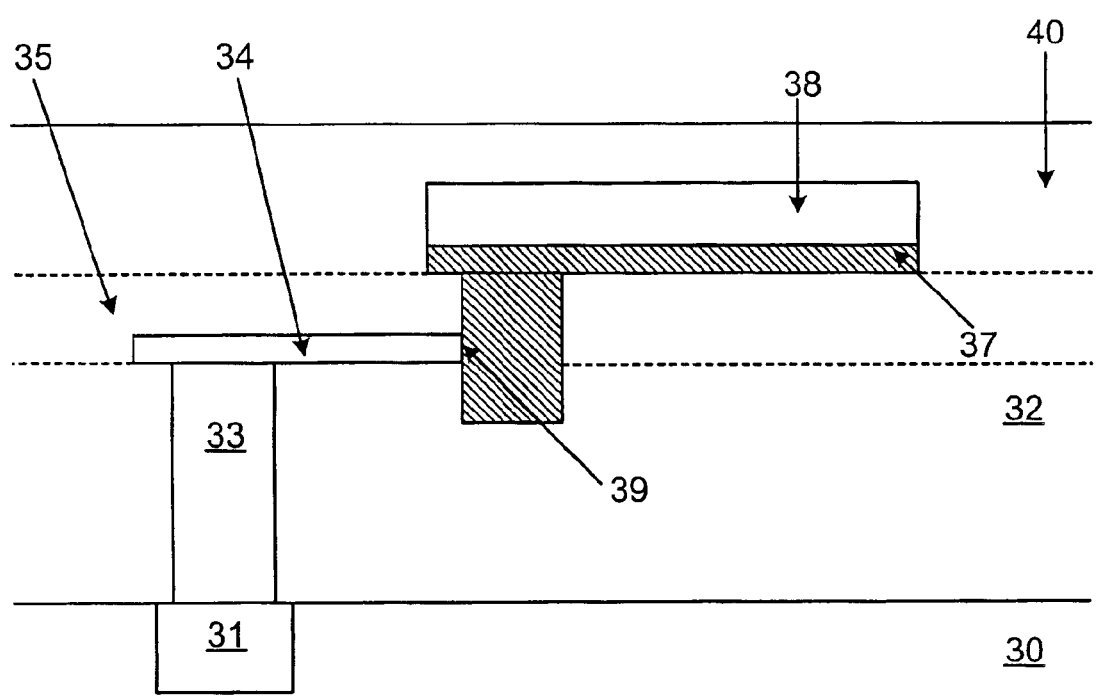

Afterwards, a top electrode layer 38 is deposited and patterned on top of chalcogenide layer 37, as shown in FIG. 3g using well-known masking and depositing techniques. Top electrode layer 38 can be a metal layer or a polysilicon layer. Finally, a dielectric layer 40 is deposited on top of top electrode layer 38 and dielectric layer 35. Dielectric layer 40 may or may not be made of the same material as dielectric layers 32 and 35.

Figure 4:
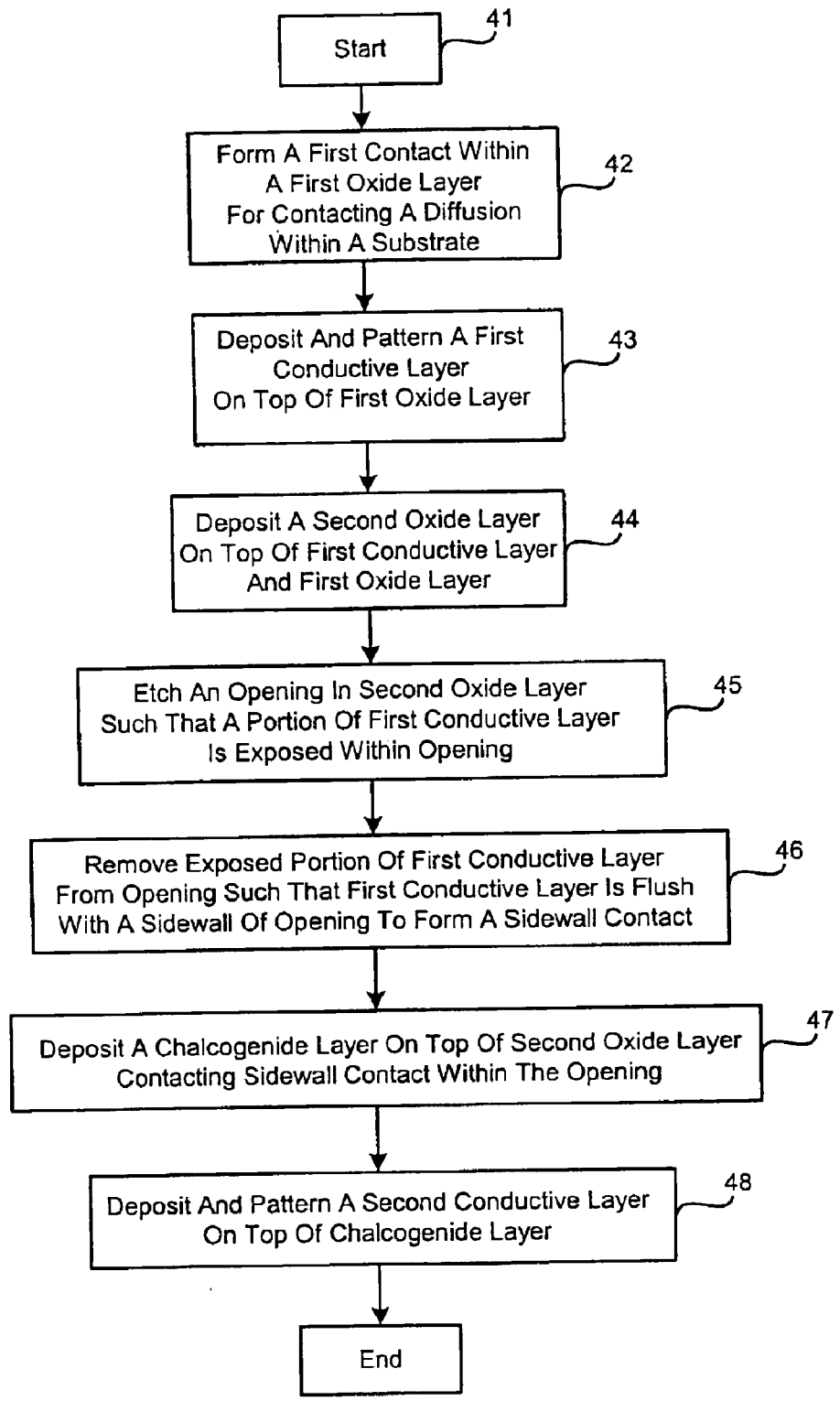
FIG. 4 is a high-level process flow diagram of a method for manufacturing the sidewall contact from FIGS. 3a–3g, in accordance with a preferred embodiment of the present invention.

With reference now to FIG. 4, there is depicted a high-level process flow diagram of a method for manufacturing the sidewall contact from FIGS. 3a–3g, in accordance with a preferred embodiment of the present invention. Starting at block 41, a first contact is formed within a first oxide layer on a substrate, as shown in block 42. The first contact is for contacting a diffusion contained within the substrate. Then, a first conductive layer is deposited and patterned on top of the first oxide layer, as depicted in block 43. Next, a second oxide layer is deposited on top of the first conductive layer and the first oxide layer, as shown in block 44. An opening is then etched within the second oxide layer such that a portion of the first conductive layer is exposed within the opening, as depicted in block 45. Afterwards, the exposed portion of the first conductive layer is removed from the opening by a well-known etching process such that the first conductive layer is flush with an inner surface (or sidewall) of the opening to form a sidewall contact, as shown in block 46. After depositing a chalcogenide layer on top of the second oxide layer, and filling the opening with chalcogenide material, as depicted in block 47, a second conductive layer is deposited and patterned on top of the chalcogenide layer, as shown in block 48.

As has been described, the present invention provides an improved method for manufacturing sidewall contacts for a chalcogenide memory device.

While the invention has been particularly shown and described with reference to a preferred embodiment, it will be understood by those skilled in the art that various changes in form and detail may be made therein without departing from the spirit and scope of the invention.

What is claimed is:

1. A chalcogenide memory device comprising:

a substrate;

a first conductive layer in contact with a diffusion within said substrate via a first contact;

a chalcogenide layer in contact with said first conductive layer via a sidewall of a second contact; and a second conductive layer in contact with said chalcogenide layer.

2. The chalcogenide memory device of claim 1, wherein said conductive layer is a metal layer.

3. The chalcogenide memory device of claim 1, wherein said conductive layer is a polysilicon layer.

4. The chalcogenide memory device of claim 1, wherein said first conductive layer is approximately 300 Å thick.

5. The chalcogenide memory device of claim 1, wherein said second conductive layer is a metal layer.

6. The chalcogenide memory device of claim 1, wherein said second conductive layer is a polysilicon layer.

7. The chalcogenide memory device of claim 1, wherein said second conductive layer is approximately 300 Å thick.

8. The chalcogenide memory device of claim 1, wherein said chalcogenide layer is approximately 500 Å thick.

* * * * *

UNITED STATES PATENT AND TRADEMARK OFFICE
CERTIFICATE OF CORRECTION

| | | |
|---|---|---|
| PATENT NO. | : 6,909,107 B2 | Page 1 of 1 |
| APPLICATION NO. | : 10/831785 | |
| DATED | : June 21, 2005 | |
| INVENTOR(S) | : Rodgers et al. | |

It is certified that error appears in the above-identified patent and that said Letters Patent is hereby corrected as shown below:

At (73) <u>Assignee</u>, the listed Assignee's name should be corrected by deleting the 'commas':

--BAE Systems Information and Electronic Systems Integration Inc.--

At (73) <u>Assignee</u>, a Co-Assignee should be shown, pursuant to the Notice of Recordation of Assignment Document dated Jan. 10, 2005:

--OVONYX INC., Boise, Idaho (US)--

Signed and Sealed this

First Day of August, 2006

JON W. DUDAS
*Director of the United States Patent and Trademark Office*